(12) United States Patent
Gao et al.

(10) Patent No.: US 11,443,669 B2
(45) Date of Patent: Sep. 13, 2022

(54) DRIVING CIRCUIT AND DISPLAY DEVICE FOR IMPROVING ELECTRICAL PERFORMANCE OF CIRCUIT UNIT

(71) Applicant: Shenzhen China Star Optoelectronics Semiconductor Display Technology Co., LTD., Guangdong (CN)

(72) Inventors: Yanan Gao, Guangdong (CN); Bangyin Peng, Guangdong (CN); Ilgon Kim, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 203 days.

(21) Appl. No.: 16/767,769

(22) PCT Filed: May 9, 2020

(86) PCT No.: PCT/CN2020/089392
§ 371 (c)(1),
(2) Date: May 28, 2020

(87) PCT Pub. No.: WO2021/212555
PCT Pub. Date: Oct. 28, 2021

(65) Prior Publication Data
US 2022/0122505 A1 Apr. 21, 2022

(30) Foreign Application Priority Data
Apr. 23, 2020 (CN) .......................... 202010327925.2

(51) Int. Cl.
G09G 3/20 (2006.01)
(52) U.S. Cl.
CPC ....... *G09G 3/20* (2013.01); *G09G 2300/0408* (2013.01); *G09G 2300/0413* (2013.01);
(Continued)
(58) Field of Classification Search
None
See application file for complete search history.

(56) References Cited

U.S. PATENT DOCUMENTS

2010/0051952 A1* 3/2010 Kim .................... H01L 27/1214
438/151
2010/0225621 A1 9/2010 Jung et al.
(Continued)

FOREIGN PATENT DOCUMENTS

CN 101893798 A 11/2010
CN 101976685 A 2/2011
(Continued)

*Primary Examiner* — Amr A Awad
*Assistant Examiner* — Donna V Bocar

(57) ABSTRACT

The present application provides a driving circuit and a display device. The driving circuit includes a circuit unit including a thin-film transistor, which includes a patterned member; a capacitor, connected to at least one end of the thin-film transistor of the circuit unit, the capacitor includes an electrode plate; and a redundant patterned member, the redundant patterned member, the electrode plate and the patterned member located in a same conductive layer, the redundant patterned member connected between the patterned member and the electrode plate.

12 Claims, 3 Drawing Sheets

(52) U.S. Cl.
CPC ............... *G09G 2300/0426* (2013.01); *G09G 2300/0876* (2013.01)

(56) References Cited

U.S. PATENT DOCUMENTS

| | | | |
|---|---|---|---|
| 2017/0170075 A1 | 6/2017 | Jeon et al. | |
| 2017/0343865 A1* | 11/2017 | Kim | G11C 19/28 |
| 2020/0035684 A1 | 1/2020 | Wang et al. | |
| 2020/0118509 A1 | 4/2020 | Noh et al. | |
| 2021/0375186 A1* | 12/2021 | Wang | G02F 1/13 |

FOREIGN PATENT DOCUMENTS

| | | |
|---|---|---|
| CN | 104103689 A | 10/2014 |
| CN | 105047163 A | 11/2015 |
| CN | 107492542 A | 12/2017 |
| CN | 111048025 A | 4/2020 |
| TW | 468223 B | 12/2001 |

\* cited by examiner

DRIVING CIRCUIT AND DISPLAY DEVICE FOR IMPROVING ELECTRICAL PERFORMANCE OF CIRCUIT UNIT

FIELD OF THE DISCLOSURE

The present application relates to display technologies, and more particularly to a driving circuit and a display device.

DESCRIPTION OF RELATED ARTS

FIG. 1 is a schematic diagram illustrating a plan view of a pull-up unit T and a bootstrap capacitor that are connected to each other in a conventional gate driving circuit (Gate On Array, GOA). The pull-up unit T includes a plurality of thin-film transistors that are connected in series and arranged in an array. Each of the thin-film transistors includes a gate, a source and a drain. The bootstrap capacitor C includes a first electrode and a second electrode. The gates of the plurality of thin-film transistors arranged in an array and the first electrode of the bootstrap capacitor are located in a whole piece of first metal layer M1. The sources and drains (S, D) of the plurality of thin-film transistors arranged in an array and the second electrode 1 of the bootstrap capacitor are located in a patterned second metal M2. Since the second electrode 1 is a piece of whole metal, this will cause the sources and drains (S, D) of the thin-film transistors close to and connected to the second electrode 1 to have an uneven etching problem to affect electrical performance of the pull-up unit T.

Accordingly, there is a need to provide a technical solution to solve the problem of affected electrical performance of the pull-up unit T, caused by uneven etching for the sources and drains of the thin-film transistors of the pull-up unit T, where the thin-film transistors are connected to the bootstrap capacitor.

Technical Problems

The objective of the present application is to provide a driving circuit and a display device, for solving the problem of affected electrical performance of the pull-up unit, caused by uneven etching for the sources and drains of the thin-film transistors of the pull-up unit of a gate driving circuit, where the thin-film transistors are connected to the bootstrap capacitor.

Technical Solutions

To achieve above objective, the present application provides a driving circuit, including:

a circuit unit, including a thin-film transistor which includes a patterned member;

a capacitor, connected to at least one end of the thin-film transistor of the circuit unit, the capacitor including an electrode plate; and a redundant patterned member, the redundant patterned member, the electrode plate and the patterned member located in a same conductive layer, the redundant patterned member connected between the patterned member and the electrode plate, wherein material of the conductive layer is selected from at least one of molybdenum, aluminum, titanium, copper and silver.

In above driving circuit, the driving circuit includes a dummy thin-film transistor, which includes the redundant patterned member, wherein the patterned member includes a source and a drain, the redundant patterned member includes a redundant source and a redundant drain, the redundant source is connected to the redundant drain.

In above driving circuit, the source is identical to the redundant source and the drain is identical to the redundant drain.

In above driving circuit, the driving circuit is a gate driving circuit configured to output scan signals.

In above driving circuit, the circuit unit is a pull-up unit, one end of the capacitor is connected to a gate of the thin-film transistor and the other end of the capacitor is connected to a source or a drain of the thin-film transistor.

A driving circuit, including:

a circuit unit, including a thin-film transistor which includes a patterned member;

a capacitor, connected to at least one end of the thin-film transistor of the circuit unit, the capacitor including an electrode plate; and a redundant patterned member, the redundant patterned member, the electrode plate and the patterned member located in a same conductive layer, the redundant patterned member connected between the patterned member and the electrode plate.

In above driving circuit, the driving circuit includes a dummy thin-film transistor, which includes the redundant patterned member, wherein the patterned member includes a source and a drain, the redundant patterned member includes a redundant source and a redundant drain, the redundant source is connected to the redundant drain.

In above driving circuit, the source is identical to the redundant source and the drain is identical to the redundant drain.

In above driving circuit, the driving circuit is a gate driving circuit configured to output scan signals.

In above driving circuit, the circuit unit is a pull-up unit, one end of the capacitor is connected to a gate of the thin-film transistor and the other end of the capacitor is connected to a source or a drain of the thin-film transistor.

A display device, including a driving circuit which includes:

a circuit unit, including a thin-film transistor which includes a patterned member;

a capacitor, connected to at least one end of the thin-film transistor of the circuit unit, the capacitor including an electrode plate; and a redundant patterned member, the redundant patterned member, the electrode plate and the patterned member located in a same conductive layer, the redundant patterned member connected between the patterned member and the electrode plate.

In above display device, the driving circuit includes a dummy thin-film transistor, which includes the redundant patterned member, wherein the patterned member includes a source and a drain, the redundant patterned member includes a redundant source and a redundant drain, the redundant source is connected to the redundant drain.

In above display device, the source is identical to the redundant source and the drain is identical to the redundant drain.

In above display device, the driving circuit is a gate driving circuit configured to output scan signals.

In above display device, the circuit unit is a pull-up unit, one end of the capacitor is connected to a gate of the thin-film transistor and the other end of the capacitor is connected to a source or a drain of the thin-film transistor.

BENEFICIAL EFFECTS

The present application provides a driving circuit and a display device. The driving circuit includes a circuit unit including a thin-film transistor, which includes a patterned member; a capacitor, connected to at least one end of the thin-film transistor of the circuit unit, the capacitor includes an electrode plate; a redundant patterned member, the redundant patterned member, the electrode plate and the patterned member located in a same conductive layer, the redundant patterned member connected between the patterned member and the electrode plate. By disposing the redundant patterned member between the patterned member constructing the thin-film transistor and the electrode plate of the capacitor, uneven etching is prevented from occurring on the patterned member of the thin-film transistor in the process of patterning the conductive layer, where the uneven etching may affect the electrical properties of the thin-film transistor of the circuit unit.

DESCRIPTION OF EMBODIMENTS OF THE DISCLOSURE

The technical solutions in the embodiments of the present application will be clearly and completely described below with reference to appended drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application.

Figure 1:
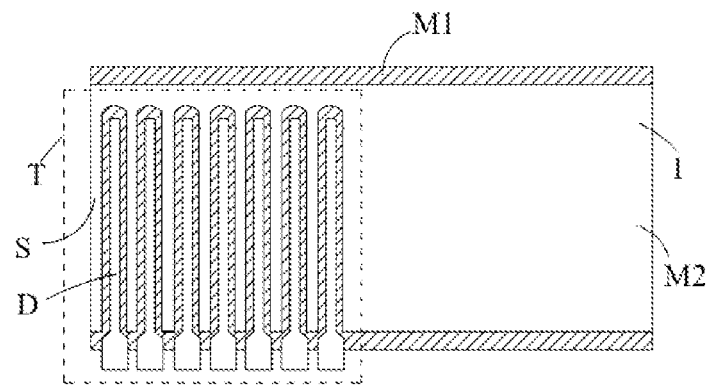
FIG. 1 is a schematic diagram illustrating a plan view of a pull-up unit T and a bootstrap capacitor C that are connected to each other in a conventional gate driving circuit.
Figure 2:
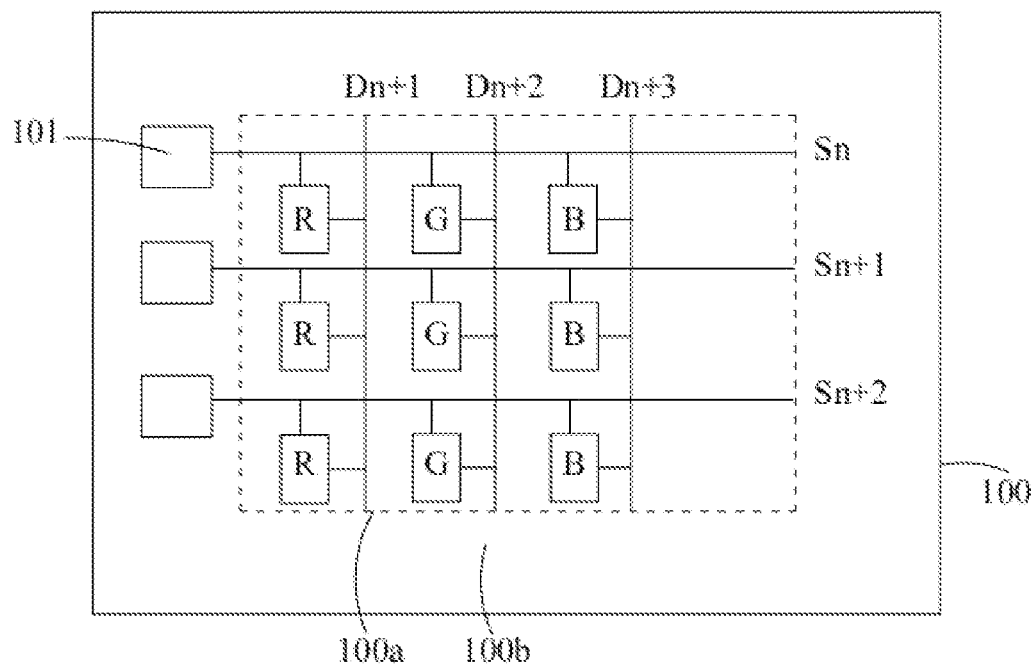
FIG. 2 is schematic diagram illustrating a display device according to an embodiment of the present embodiment.
Figure 3:
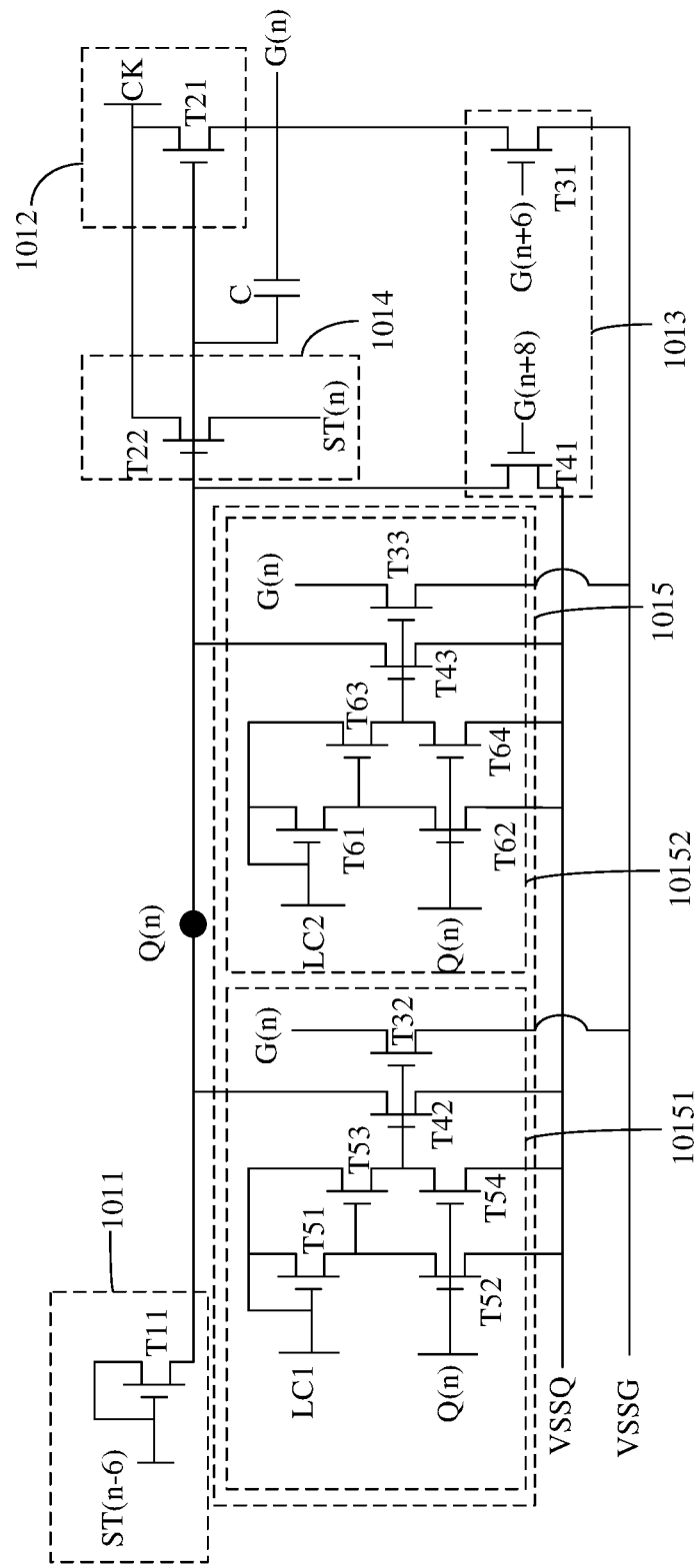
FIG. 3 is a schematic diagram illustrating a driving circuit in the display device shown in FIG. 2.
Figure 4:
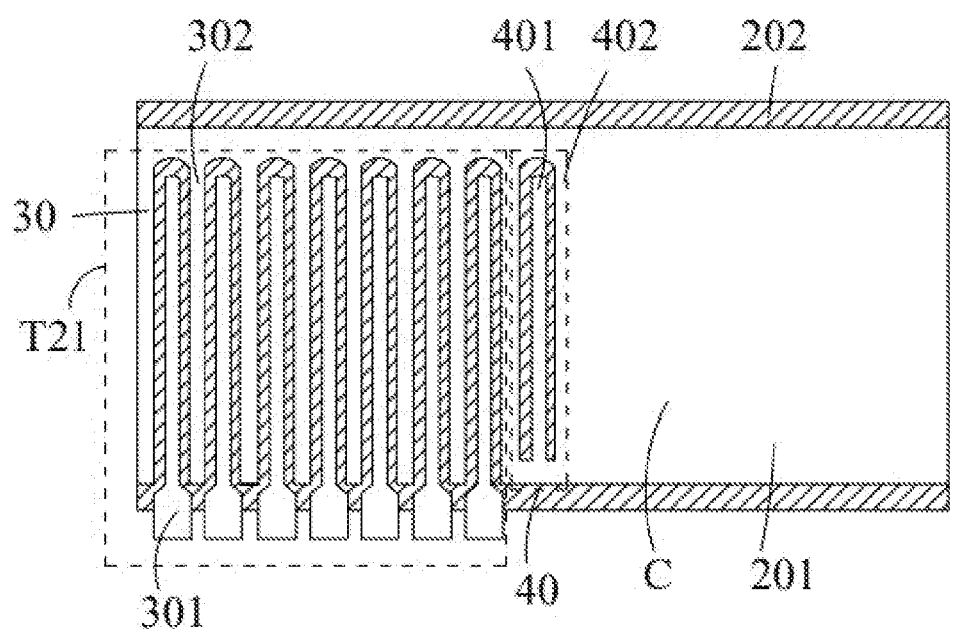
FIG. 4 is a schematic diagram illustrating a plan view of a pull-up unit and a bootstrap capacitor of a gate driving circuit shown in FIG. 3.

Please refer to FIGS. 2 to 4. FIG. 2 is schematic diagram illustrating a display device according to an embodiment of the present embodiment. FIG. 3 is a schematic diagram illustrating a driving circuit in the display device shown in FIG. 2. FIG. 4 is a schematic diagram illustrating a plan view of a pull-up unit and a bootstrap capacitor of a gate driving circuit shown in FIG. 3.

The display device includes a display panel 100 having a display region 100a and a non-display region 100b located at periphery of the display region 100a.

A plurality of data lines D (Dn, Dn+1, Dn+2) and a plurality of scan lines S (Sn, Sn+1, Sn+2) are disposed in the display region 100a of the display panel 100. The plurality of data lines are arranged along a column direction and are parallel to each other. The plurality of scan lines S (Sn, Sn+1, Sn+2) are arranged along a row direction and are parallel to each other. The data lines D and the scan lines S are perpendicular to each other and are insulated. A subpixel is disposed between two adjacent data lines D and between two adjacent scan lines S. The subpixels of a same row are connected to a same scan line S. The subpixels of a same column are connected to a same data line D. The subpixels of a same column emit light of a same color. The subpixels of a same row include a red subpixel R, a green subpixel G and a blue subpixel B. The red subpixel R, the green subpixel G and the blue subpixel B are sequentially disposed in a same row and the three subpixels are repeatedly disposed along a same row as a repeating unit.

A driving circuit 101 is disposed in the non-display region 100b of the display panel 100. The driving circuit 101 is a gate driving circuit (Gate On Array, GOA). The gate driving circuit is configured to output scan signals to the scan lines S such that data signals transmitted by the data line D are inputted to a column of subpixels to make the column of subpixels emit light.

The gate driving circuit includes a plurality of stages of gate driving units. The gate driving circuit is illustrated below by taking a gate driving unit of a n-th stage outputting a scan signal G(n) for example and it is assumed that there are 12 clock signals CK1-CK12 for the clock signals corresponding to the gate driving circuit. It can be understood that it may have 4 clock signals CK1-CK4 or 8 clock signals CK1-CK8 for the clock signals corresponding to the gate driving circuit.

The driving circuit 101 includes a pull-up control unit 1011, a pull-up unit 1012, a pull-down unit 1013, a down transmission unit 1014, a capacitor C and a pull-down remaining unit 1015.

The pull-down control unit 1011 is coupled to a pull-up node Q(n) and is configured to output a pull-up control signal to the pull-up node Q(n) according to a down transmission signal ST(n−6) of a (n−6)th stage.

Specifically, the pull-up control unit 1011 includes a first thin-film transistor T11. A control end and a first end of the first thin-film transistor T11 is connected to a (n−6)th-stage down transmission signal input end ST(n−6), and a second end of the first thin-film transistor T11 is connected to the pull-up node Q(n).

The pull-up unit 1012 is coupled to the pull-up node Q(n) and is configured to output a nth-stage scan signal according to a clock signal and the pull-up control signal.

Specifically, the pull-up unit 1012 includes a second thin-film transistor T21. A control end of the second thin-film transistor T21 is connected to the pull-up node Q(n), a first end of the second thin-film transistor T21 is connected to a clock signal input end CK and a second end of the second thin-film transistor T21 is connected to a nth-stage scan signal output end G(n).

The pull-down unit 1013 is coupled to the pull-up node Q(n) and the pull-up unit 1012 and is configured to input a first direct-current low level signal to the pull-up node Q(n) according to a (n+8)th-stage scan signal and input a second direct-current low level signal to the nth-stage scan signal output end G(n) according to a (n+6)th-stage scan signal.

Specifically, the pull-down unit 1013 includes a third thin-film transistor T31 and a fourth thin-film transistor T41. A control end of the third thin-film transistor T31 is connected to a (n+6)th-stage scan signal input end G(n+6), a first end of the third thin-film transistor T31 is connected to a second direct-current low level signal line VSSG and a second end of the third thin-film transistor T31 is connected to the nth-stage scan signal output end G(n). A control end of the fourth thin-film transistor T41 is connected to a (n+8)th-stage scan signal input end G(n+8), a first end of the fourth thin-film transistor T41 is connected to a first direct-current low level signal line VSSQ and a second end of the fourth thin-film transistor T41 is connected to the pull-up node Q(n).

The down transmission unit 1014 is coupled to the pull-up node Q(n) and is configured to output a nth-stage down transmission signal according to the clock signal and the pull-up control signal.

Specifically, the down transmission unit 1014 includes a fifth thin-film transistor T22. A control end of the fifth thin-film transistor T22 is connected to the pull-up node Q(n), a first end of the fifth thin-film transistor T22 is connected to the clock signal input end CK and a second end of the fifth thin-film transistor T22 is connected to the nth-stage down transmission signal output end ST(n).

The capacitor C is coupled to the pull-up node Q(n) and the pull-up unit 1012 and is configured to lift up the potential of the pull-up node Q(n).

Specifically, one end of the capacitor C is connected to the pull-up node Q(n) and the other end of the capacitor C is connected to the nth-stage scan signal output end G(n). That is, the two ends of the capacitor C are connected to the gate and the second end of the second thin-film transistor T21, respectively. When the nth-stage scan signal outputted by the nth-stage scan signal output end G(n) is at high level, the coupling of the capacitor C makes the potential of the pull-up node Q(n) lift up.

The pull-down remaining unit 1015 is coupled to the pull-up node Q(n) and is configured to keep the potential of the pull-up node Q(n) based on the potential of the pull-up node Q(n). The pull-down remaining unit 1015 includes a first pull-down remaining unit 10151 and a second pull-down remaining unit 10152.

Specifically, the first pull-down remaining unit 10151 includes a sixth thin-film transistor T51, a seventh thin-film transistor T52, an eighth thin-film transistor T53, a ninth thin-film transistor T54, a tenth thin-film transistor T42 and an eleventh thin-film transistor T32. A control end and a first end of the sixth thin-film transistor T51 are connected to a first low-frequency clock signal input end LC1 and a second end of the sixth thin-film transistor T51 is connected to a control end of the eighth thin-film transistor T53 and a second end of the seventh thin-film transistor T52. A control end of the seventh thin-film transistor T52 is connected to the pull-up node Q(n), a first end of the seventh thin-film transistor T52 is connected to the first direct-current low level signal line VSSQ and a second end of the seventh thin-film transistor T52 is connected to a control end of the eighth thin-film transistor T53 and the second end of the sixth thin-film transistor T51. The control end of the eighth thin-film transistor T53 is connected to the second end of the sixth thin-film transistor T51 and the second end of the seventh thin-film transistor T52, a first end of the eighth thin-film transistor T53 is connected to the first low-frequency clock signal input end LC1 and a second end of the eighth thin-film transistor T53 is connected to a control end of the tenth thin-film transistor T42 and a second end of the ninth thin-film transistor T54. A control end of the ninth thin-film transistor T54 is connected to the pull-up node Q(n), a first end of the ninth thin-film transistor T54 is connected to the first direct-current low level signal line VSSQ and the second end of the ninth thin-film transistor T54 is connected to the second end of the eighth thin-film transistor T53 and a control end of the tenth thin-film transistor T42. The control end of the tenth thin-film transistor T42 is connected to the second end of the eighth thin-film transistor T53 and the second end of the ninth thin-film transistor T54, a first end of the tenth thin-film transistor T42 is connected to the first direct-current low level signal line VSSQ and a second end of the tenth thin-film transistor T42 is connected to the pull-up node Q(n). A control end of the eleventh thin-film transistor T32 is connected to the second end of the eighth thin-film transistor T53 and the second end of the ninth thin-film transistor T54, a first end of the eleventh thin-film transistor T32 is connected to the second direct-current low level signal line VSSG and a second end of the eleventh thin-film transistor T32 is connected to the nth-stage scan signal output end G(n).

The second pull-down remaining unit 10152 includes a twelfth thin-film transistor T61, a thirteenth transistor T62, a fourteenth thin-film transistor T63, a fifteenth thin-film transistor T64, a sixteenth thin-film transistor T43 and a seventeenth thin-film transistor T33. A control end and a first end of the twelfth thin-film transistor T61 are connected to a second low-frequency clock signal input end LC2 and a second end of the twelfth thin-film transistor T61 is connected to a control end of the fourteenth thin-film transistor T63 and a second end of the thirteenth thin-film transistor T62. A control end of the thirteenth thin-film transistor T62 is connected to the pull-up node Q(n), a first end of the thirteenth thin-film transistor T62 is connected to the first direct-current low level signal line VSSQ and a second end of the thirteenth thin-film transistor T62 is connected to a control end of the fourteenth thin-film transistor T63 and the second end of the twelfth thin-film transistor T61. The control end of the fourteenth thin-film transistor T63 is connected to the second end of the twelfth thin-film transistor T61 and the second end of the thirteenth thin-film transistor T62, a first end of the fourteenth thin-film transistor T63 is connected to the second low-frequency clock signal input end LC2 and a second end of the fourteenth thin-film transistor T63 is connected to a second end of the fifteenth thin-film transistor T64 and a control end of the sixteenth thin-film transistor T43. A control end of the fifteenth thin-film transistor T64 is connected to the pull-up node Q(n), a first end of the fifteenth thin-film transistor T64 is connected to the first direct-current low level signal line VSSQ and a second end of the fifteenth thin-film transistor T64 is connected to a control end of the sixteenth thin-film transistor T43 and the second end of the fourteenth thin-film transistor T63. The control end of the sixteenth thin-film transistor T43 is connected to the second end of the fourteenth thin-film transistor T63 and the second end of the fifteenth thin-film transistor T64, a first end of the sixteenth thin-film transistor T43 is connected to the first direct-current low level signal line VSSQ and a second end of the sixteenth thin-film transistor T43 is connected to the pull-up node Q(n). A control end of the seventeenth thin-film transistor T33 is connected to the second end of the fourteenth thin-film transistor T63 and the second end of the fifteenth thin-film transistor T64, a first end of the seventeenth thin-film transistor T33 is connected to the second direct-current low level signal line VSSG and a second end of the seventeenth thin-film transistor T33 is connected to the nth-stage scan signal output end G(n).

For a high-resolution display device, the second thin-film transistor T21 needs a great driving ability. When deploying the second thin-film transistor T21, a plurality of sub thin-film transistors are connected in series and arranged in an array so as to form the second thin-film transistor T21 having a large channel width W/channel length L. One end of the capacitor C is connected to the gate of the second thin-film transistor T21 and the other end of the capacitor C is connected to the source or the drain of the second thin-film transistor T21. The capacitor C includes a first electrode plate 201 and a second electrode plate 202.

The second thin-film transistor T21 includes a patterned member 30. The patterned member 30 includes sources 302 and drains 301. One source 302 corresponds to one drain 301. The plural sources 302 and the plural drains 301 and arranged in an array. The drains 301 has a strip shape and the sources 302 has a U shape. The driving circuit further includes a redundant patterned member 40. The first electrode plate 201 of the capacitor C, the redundant patterned member 40 and the patterned member 30 are located in a same conductive layer. Material of the conductive layer is selected from at least one of molybdenum, aluminum, titanium, copper and silver. As such, when it needs to etch in a conventional yellow-light photolithography process to obtain the patterned member 30 of the second thin-film transistor T21, the concentration of developer solution used to develop photoresist in the yellow-light process will not change since a member to be etched beside the patterned member 30 is the redundant patterned member 40. This will not cause the patterned member 30 to be over etched or insufficiently etched in subsequent processes.

The driving circuit further includes a dummy thin-film transistor. The dummy thin-film transistor includes the redundant patterned member 40. The redundant patterned member 40 includes a redundant source 402 and a redundant drain 401. The redundant source 402 is connected to the redundant drain 401 such that the redundant patterned member 40 is equivalent to an electrode plate of the capacitor C. A connection is established between the redundant patterned member 40 and the first electrode plate 201. The first electrode plate 201 is a whole piece of conductive layer. In the process of utilizing the conventional yellow-light process to obtain the redundant patterned member 40 by etching, since what is to be etched is a whole piece of conductive layer, the concentration of developer solution will change and this may cause the redundant patterned member 40 unable to be etched to form a pattern as designed. However, connecting the redundant source and the redundant drain can prevent the dummy thin-film transistor from becoming a part of the second thin-film transistor T21 and avoid resulting in poor electrical properties of the second thin-film transistor T21 due to poor electrical properties of the dummy thin-film transistor. Also, the design of dummy thin-film transistor is more beneficial to simplification of the process.

The second thin-film transistor T21 further includes a gate. The gates of the plural sub thin-film transistors and the second electrode plate 202 of the capacitor C form another conductive layer of a whole plane. This conductive layer is insulated from the conductive layer where the sources and the drains of the plural sub thin-film transistors are located. Material of the another conductive layer is selected from at least one of molybdenum, aluminum, titanium, copper and silver.

The sources 302 are identical to the redundant source 402 and the drains 301 are identical to the redundant drain 401. That is, the shape and size of the sources 302 and the redundant drain 402 are same and the shape and size of the drains 301 and the redundant drain 401 are same. In an aspect, this is adaptive to the limitation of etching accuracy. In another aspect, this makes the area of the redundant patterned member 40 large enough to form the electrode plate of the capacitor C to improve the capacitance of the capacitor C.

The present application further provides a driving circuit, including:
a circuit unit, including a thin-film transistor which includes a patterned member;
a capacitor, connected to at least one end of the thin-film transistor of the circuit unit, the capacitor includes an electrode plate; and
a redundant patterned member, the redundant patterned member, the electrode plate and the patterned member located in a same conductive layer, the redundant patterned member connected between the patterned member and the electrode plate.

The driving circuit includes a dummy thin-film transistor, which includes the redundant patterned member, wherein the patterned member includes a source and a drain, the redundant patterned member includes a redundant source and a redundant drain, the redundant source is connected to the redundant drain. The source is identical to the redundant source and the drain is identical to the redundant drain.

The driving circuit is a gate driving circuit configured to output scan signals. The circuit unit is a pull-up unit, one end of the capacitor is connected to a gate of the thin-film transistor and the other end of the capacitor is connected to the source or the drain of the thin-film transistor.

The invention claimed is:

1. A driving circuit, comprising:
a circuit unit, comprising a thin-film transistor which comprises a patterned member;
a capacitor, connected to at least one end of the thin-film transistor of the circuit unit, the capacitor comprising an electrode plate; and
a redundant patterned member, the redundant patterned member, the electrode plate and the patterned member located in a same conductive layer, the redundant patterned member connected between the patterned member and the electrode plate,
wherein material of the conductive layer is selected from at least one of molybdenum, aluminum, titanium, copper and silver,
wherein the driving circuit further comprises a dummy thin-film transistor, which comprises the redundant patterned member, wherein the patterned member comprises a source and a drain, the redundant patterned member comprises a redundant source and a redundant drain, the redundant source is directly connected to the redundant drain.

2. The driving circuit according to claim 1, wherein the source is identical to the redundant source and the drain is identical to the redundant drain.

3. The driving circuit according to claim 1, wherein the driving circuit is a gate driving circuit configured to output scan signals.

4. The driving circuit according to claim 3, wherein the circuit unit is a pull-up unit, one end of the capacitor is connected to a gate of the thin-film transistor and the other end of the capacitor is connected to a source or a drain of the thin-film transistor.

5. A driving circuit, comprising:
a circuit unit, comprising a thin-film transistor which comprises a patterned member;
a capacitor, connected to at least one end of the thin-film transistor of the circuit unit, the capacitor comprising an electrode plate; and
a redundant patterned member, the redundant patterned member, the electrode plate and the patterned member located in a same conductive layer, the redundant patterned member connected between the patterned member and the electrode plate, wherein the driving circuit further comprises a dummy thin-film transistor, which comprises the redundant patterned member, wherein the patterned member comprises a source and a drain, the redundant patterned member comprises a redundant source and a redundant drain, the redundant source is directly connected to the redundant drain.

6. The driving circuit according to claim 5, wherein the source is identical to the redundant source and the drain is identical to the redundant drain.

7. The driving circuit according to claim 5, wherein the driving circuit is a gate driving circuit configured to output scan signals.

8. The driving circuit according to claim 7, wherein the circuit unit is a pull-up unit, one end of the capacitor is connected to a gate of the thin-film transistor and the other end of the capacitor is connected to a source or a drain of the thin-film transistor.

9. A display device, comprising a driving circuit which comprises:
   a circuit unit, comprising a thin-film transistor which comprises a patterned member;
   a capacitor, connected to at least one end of the thin-film transistor of the circuit unit, the capacitor comprising an electrode plate; and
   a redundant patterned member, the redundant patterned member, the electrode plate and the patterned member located in a same conductive layer, the redundant patterned member connected between the patterned member and the electrode plate, wherein the driving circuit further comprises a dummy thin-film transistor, which comprises the redundant patterned member, wherein the patterned member comprises a source and a drain, the redundant patterned member comprises a redundant source and a redundant drain, the redundant source is directly connected to the redundant drain.

10. The display device according to claim 9, wherein the source is identical to the redundant source and the drain is identical to the redundant drain.

11. The display device according to claim 9, wherein the driving circuit is a gate driving circuit configured to output scan signals.

12. The display device according to claim 11, wherein the circuit unit is a pull-up unit, one end of the capacitor is connected to a gate of the thin-film transistor and the other end of the capacitor is connected to a source or a drain of the thin-film transistor.

* * * * *